(12) United States Patent
Wallace et al.

(10) Patent No.: US 8,084,767 B2
(45) Date of Patent: Dec. 27, 2011

(54) OPTO-ELECTRICAL DEVICES AND METHODS OF MANUFACTURING THE SAME

(75) Inventors: Paul Wallace, Cambridge (GB); Simon Goddard, Impington (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 161 days.

(21) Appl. No.: 12/376,111

(22) PCT Filed: Aug. 1, 2007

(86) PCT No.: PCT/GB2007/002922
§ 371 (c)(1),
(2), (4) Date: May 21, 2009

(87) PCT Pub. No.: WO2008/015426
PCT Pub. Date: Feb. 7, 2008

(65) Prior Publication Data
US 2009/0315023 A1 Dec. 24, 2009

(30) Foreign Application Priority Data

Aug. 1, 2006 (GB) .................................. 0615278.9
Aug. 1, 2006 (GB) .................................. 0615279.7
May 16, 2007 (GB) .................................. 0709430.3

(51) Int. Cl.
*H01L 51/00* (2006.01)
(52) U.S. Cl. ...................... 257/40; 257/E51.027; 438/99
(58) Field of Classification Search .................. 257/40, 257/E51.027; 438/99
See application file for complete search history.

(56) References Cited

U.S. PATENT DOCUMENTS

| 4,539,507 | A | 9/1985 | VanSlyke et al. |
| 5,150,006 | A | 9/1992 | Van Slyke et al. |
| 5,432,014 | A | 7/1995 | Sano et al. |
| 5,621,131 | A | 4/1997 | Kreuder et al. |
| 6,078,274 | A * | 6/2000 | Inou ................................. 341/34 |
| 6,083,634 | A | 7/2000 | Shi |
| 6,353,083 | B1 | 3/2002 | Inbasekaran et al. |
| 6,953,628 | B2 | 10/2005 | Kamatani et al. |
| 7,125,998 | B2 | 10/2006 | Stossel et al. |
| 7,238,435 | B2 | 7/2007 | Kamatani et al. |
| 7,250,226 | B2 | 7/2007 | Tokito et al. |
| 2002/0117662 | A1 | 8/2002 | Nii |
| 2002/0182441 | A1 | 12/2002 | Lamansky et al. |
| 2003/0230967 | A1* | 12/2003 | Kawamura et al. ........... 313/483 |

(Continued)

FOREIGN PATENT DOCUMENTS
EP 0707020 4/1996
(Continued)

OTHER PUBLICATIONS

International Search Report and Written Opinion for PCT/GB2007/002922 dated Dec. 4, 2007.
Combined Search and Examination Report for GB 0615279.7 dated Nov. 29, 2006.

(Continued)

*Primary Examiner* — Tu-Tu Ho
(74) *Attorney, Agent, or Firm* — Marshall, Gerstein & Borun LLP

(57) ABSTRACT

A composition for use in the manufacture of an opto-electrical device, the composition comprising: a conductive or semi-conductive organic material; a solvent; and a first additive, wherein the first additive is an alcohol ether having a boiling point lower than 170° C.

20 Claims, 2 Drawing Sheets

U.S. PATENT DOCUMENTS

| | | | |
|---|---|---|---|
| 2004/0147555 A1 | 7/2004 | Fujimoto et al. | |
| 2004/0247814 A1* | 12/2004 | Sirringhaus et al. | 428/64.1 |
| 2005/0082515 A1 | 4/2005 | Masuichi et al. | |
| 2005/0239933 A1* | 10/2005 | Lee et al. | 524/261 |
| 2005/0255616 A1* | 11/2005 | Childs et al. | 438/22 |
| 2006/0177694 A1 | 8/2006 | Kamatani et al. | |

FOREIGN PATENT DOCUMENTS

| | | |
|---|---|---|
| EP | 0842208 | 5/1998 |
| EP | 0880303 | 11/1998 |
| EP | 0989778 | 3/2000 |
| EP | 1245659 | 10/2002 |
| JP | 2002324679 | 11/2002 |
| WO | WO-9013148 | 11/1990 |
| WO | WO-9506400 | 3/1995 |
| WO | WO-9921935 | 5/1999 |
| WO | WO-9948160 | 9/1999 |
| WO | WO-0053656 | 9/2000 |
| WO | WO-0055927 | 9/2000 |
| WO | WO-0119142 | 3/2001 |
| WO | WO-0162869 | 8/2001 |
| WO | WO-0181649 | 11/2001 |
| WO | WO-0231896 | 4/2002 |
| WO | WO-0244189 | 6/2002 |
| WO | WO-0245466 | 6/2002 |
| WO | WO-02/066552 | 8/2002 |
| WO | WO-02/067343 | 8/2002 |
| WO | WO-02/068435 | 9/2002 |
| WO | WO-02/081448 | 10/2002 |
| WO | WO-03/018653 | 3/2003 |
| WO | WO-03/022908 | 3/2003 |
| WO | WO-03083960 | 10/2003 |
| WO | WO-2004/063256 | 7/2004 |
| WO | WO-2004063277 | 7/2004 |
| WO | WO-2004094501 | 11/2004 |
| WO | WO-2004/105150 | 12/2004 |
| WO | WO-2005/076386 | 8/2005 |
| WO | WO-2006123167 | 11/2006 |

OTHER PUBLICATIONS

Baldo et al., "Very high-efficiency green organic light-emitting devices based on electrophosphorescence," *Applied Physics Letters*, 75:4-6 (1999).

Chen et al., "Triplet exciton confinement in phosphorescent polymer light-emitting diodes," *Applied Physics Letters*, 82:1006-1008 (2003).

Chen et al., "Recent Developments in Molecular Organic Electroluminescent Materials," *Macromol. Symp.*, 125:1-48 (1997).

Cleave et al., "Harvesting Singlet and Triplet Energy in Polymer LEDs," *Adv. Matter*, 11:285-288 (1999).

Duineveld et al., "Ink-Jet Printing of Polymer Light-Emitting Devices," *Proceedings of SPIE*, 4464:59-67 (2002).

Ikai et al., "Highly efficient phosphorescence from organic light-emitting devices with an exciton-block layer," *Applied Physics Letters*, 79:156-158 (2001).

Lane et al., "Origin of electrophosphorescence from a doped polymer light emitting diode," *Physical Review*, 63:1-8 (2001).

Lee et al., "Polymer phosphorescent light-emitting devices doped with tris(2-phenylpyridine) iridium as a triplet emitter," *Applied Physics Letters*, 77:2280-2282 (2000).

O'Brien et al., "Electrophosphorescence from a doped polymer light emitting diode," *Synthetic Metals*, 116:379-383 (2001).

Setayesh et al., "Bridging the Gap between Polyfluorene and Ladder-Poly-p-phenylene: Synthesis and Characterization of Poly-2,8-indenofluorene," *Macromolecules*, 33:2016-2020 (2000).

Yamamoto, "Electrically Conducting and Thermally Stable $\pi$-Conjugated Poly (arylene)s Prepared by Organometallic Processes," *Prog. Polym. Sci.*, 17:1153-1205 (1992).

Yang, "Efficient blue polymer light-emitting diodes from a series of soluble poly(paraphenylene)s," *J. Appl. Phys.*, 79:934-939 (1996).

Zhu et al., "Synthesis of new iridium complexes and their electrophosphorescent properties in polymer light-emitting diodes," *J. Mater. Chem.*, 13:50-55 (2003).

\* cited by examiner

OPTO-ELECTRICAL DEVICES AND METHODS OF MANUFACTURING THE SAME

FIELD OF INVENTION

This invention relates to compositions for conductive or semi-conductive organic material, opto-electrical devices manufactured using these compositions, and methods of manufacturing these opto-electrical devices.

BACKGROUND OF INVENTION

One class of opto-electrical devices is that using an organic material for light emission (or detection in the case of photovoltaic cells and the like). The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating excitons which then undergoes radiative decay to give light (in light detecting devices this process essentially runs in reverse). In WO90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent anode such as indium-tin-oxide ("ITO"). A layer of a thin film of at least one electroluminescent organic material (which here includes organometallic material) covers the first electrode. Finally, a cathode covers the layer of electroluminescent organic material. The cathode is typically a metal or alloy and may comprise a single layer, such as aluminium, or a plurality of layers such as calcium and aluminium.

A multicoloured display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

FIG. 1 shows a vertical cross section through an example of an OLED device 100. In an active matrix display, part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent hole injection layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells thus define light emitting areas or pixels of the display.

A cathode layer 110 is then applied by, say, physical vapour deposition. The cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. The cathode may be transparent. This is particularly preferred for active matrix devices wherein emission through the substrate is partially blocked by drive circuitry located underneath the emissive pixels. In the case of a transparent cathode device, it will be appreciated that the anode is not necessarily transparent. In the case of passive matrix displays, mutual electrical isolation of cathode lines may achieved through the use of cathode separators (element 302 of FIG. 3b). Typically a number of displays are fabricated on a single substrate and at the end of the fabrication process the substrate is scribed, and the displays separated. An encapsulant such as a glass sheet or a metal can is utilized to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999. In the case of a polymer-based OLED, layers 108 comprise a hole injection layer 108a and a light emitting polymer (LEP) electroluminescent layer 108b. The electroluminescent layer may comprise, for example, around 70 nm (dry) thickness of PPV (poly(p-phenylenevinylene)) and the hole injection layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

The deposition of material for organic light emitting diodes (OLEDs) using ink jet printing techniques are described in a number of documents including, for example: EP 0880303 and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for any form of soluble organic material, including both small molecule and polymer LEDs.

FIG. 2 shows a view from above (that is, not through the substrate) of a portion of a three-colour active matrix pixellated OLED display 200 after deposition of one of the active colour layers. The figure shows an array of banks 112 and wells 114 defining pixels of the display.

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, the substrate is provided with a plurality of cathode undercut separators 302 to separate adjacent cathode lines (which will be deposited in regions 304). A plurality of wells 308 is defined by banks 310, constructed around the perimeter of each well 308 and leaving an anode layer 306 exposed at the base of the well. The edges or faces of the banks are tapered onto the surface of the substrate as shown, heretofore at an angle of between 10 and 40 degrees. The banks present a hydrophobic surface in order that they are not wetted by the solution of deposited organic material and thus assist in containing the deposited material within a well. This is achieved by treatment of a bank material such as polyimide with an $O_2/CF_4$ plasma as disclosed in EP 0989778. Alternatively, the plasma treatment step may be avoided by use of a fluorinated material such as a fluorinated polyimide as disclosed in WO 03/083960.

As previously mentioned, the bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed. In the example shown the cathode separators are around 5 µm in height and approximately 20 µm wide. Banks are generally between 20 µm and 100 µm in width and in the example shown have a 4 µm taper at each edge (so that the banks are around 1 µm in height). The pixels of FIG. 3a are approximately 300 µm square but, as described later, the size of a pixel can vary considerably, depending upon the intended application.

These devices have great potential for displays and lighting. However, there are several significant problems. One is to make the device efficient, particularly as measured by its external power efficiency and its external quantum efficiency. Another is to optimise (e.g. to reduce) the voltage at which peak efficiency is obtained. Another is to stabilise the voltage characteristics of the device over time. Another is to increase the lifetime of the device.

To this end, numerous modifications have been made to the basic device structure described above in order to solve one or more of these problems.

One such modification is the provision of a layer of conductive polymer between the light-emissive organic layer and one of the electrodes. It has been found that the provision of such a conductive polymer layer can improve the turn-on voltage, the brightness of the device at low voltage, the efficiency, the lifetime and the stability of the device. Examples of such conductive polymers include polythiophene derivatives such as poly(ethylene dioxythiophene), or polyaniline derivatives. It may be advantageous in some device arrangements to not have too high a conductivity of the conductive polymer. For example, if a plurality of electrodes are provided in a device but only one continuous layer of conductive polymer extending over all the electrodes, then too high a conductivity can lead to lateral conduction (known as "cross-talk"). Furthermore, if the conductive polymer is not covered by the overlying layer(s) of organic material between the conductive polymer and the cathode then there is a risk of shorting between the conductive polymer and the cathode.

The conductive polymer layer may also be selected to have a suitable workfunction so as to aid in hole or electron injection and/or to block holes or electrons. There are thus two key electrical features: the overall conductivity of the conductive polymer composition; and the workfunction of the conductive polymer composition. The stability of the composition and reactivity with other components in a device will also be critical in providing an acceptable lifetime for a practical device. The processability of the composition will be critical for ease of manufacture.

Conductive polymer formulations are discussed in the applicant's earlier application WO2006/123167. There is an ongoing need to optimise the organic formulations used in these devices both in the light emitting layer and the conductive polymer layer, in particular to improve inkjet performance and wetting properties of these compositions.

A problem associated with ink jet printing of materials for organic opto-electrical devices is that the printing process involves printing stripes (or swathes) of ink (corresponding to the ink jet head width) which results in an inbuilt asymmetry in the drying environment. Specifically, at a swathe edge more drying occurs on the unprinted side since the solvent concentration in the atmosphere above the substrate is less than the printed side. With more evaporation taking place on the unprinted side more solute is deposited on this side and the film profile becomes asymmetric, resulting in visible non-uniformities in the resultant display.

Another problem associated with ink jet printing of organic opto-electrical devices such as those discussed above is that in the resultant device, the organic hole injecting layer can extend beyond the overlying organic semi-conductive layer providing a shorting path between the cathode and the anode at an edge of the well. This problem is exacerbated if the contact angle of the conductive organic composition with the bank material is too low. This problem is further exacerbated if the conductivity of the organic hole injecting layer is too high. One solution to this problem is to modify the bank structure. However, providing a more complex bank structure is expensive and increases the complexity of the manufacturing method for the device.

In addition to the aforementioned problems of depositing prior art compositions using ink jet printing, it has also been found that some compositions comprising conductive and semi-conductive organic material are also difficult, or indeed impossible, to deposit by other methods such as spin-coating. As such, it is an aim of the present invention to provide compositions which are easier to deposit by any solution processing method including, for example, spin-coating as well as ink jet printing.

The present applicant seeks to solve, or at least reduce, the problems outlined above by adapting compositions, in particular compositions for ink jet printing, comprising conductive or semi-conductive organic material. These adapted compositions are of particular use in the manufacture of light-emissive devices.

WO 2004/063277 discloses addition of various co-solvents to aqueous PEDOT/PSS in order to increase the conductivity of films formed from the aqueous solution. Inkjet printing of these compositions is not disclosed.

Embodiments of the present invention seek to solve the problem associated with a rapid change in the profile of organic layers within the pixels and between the pixels surrounding a swathe join.

In addition to the aforementioned problems of depositing prior art compositions using ink jet printing, it has also been found that some compositions comprising conductive and semi-conductive organic material are also difficult, or indeed impossible, to deposit by other methods such as spin-coating. As such, it is an aim of the present invention to provide compositions which are easier to deposit by any solution processing method including, for example, spin-coating as well as ink jet printing.

SUMMARY OF THE PRESENT INVENTION

According to a first aspect of the present invention there is provided a composition for use in the manufacture of an opto-electrical device, the composition comprising: a conductive or semi-conductive organic material; a solvent; and a first additive, wherein the first additive is an alcohol ether having a boiling point lower than 170° C.

The solvent may dissolve the conductive or semiconductive organic material, or the solvent and conductive or semiconductive organic material may together form a dispersion. For example, an aqueous composition of PEDOT/PSS is in the form of a dispersion. Preferably, the composition is a dispersion. Preferably, the solvent is an aqueous solvent. Preferably, the organic material is conductive.

In the case where the composition comprises a conductive organic material, this material preferably comprises a polycation and a charge balancing polyanion, for example PEDOT with a polyanion such as PSS. Another example is polythienothiophene with a polyanion.

It has surprisingly been found that the provision of an alcohol ether additive having a boiling point lower than 170° C. results in a composition that has much better ink-jet directionality. That is, the spreading angle of droplets of the composition deposited by ink-jet printing is reduced by the presence of the additive. This is hugely beneficial for ink-jet printing of, for example, organic light-emissive displays, particularly when the pixel size of such displays is very small. The present invention reduces the possibility of ink being deposited in the wrong ink-well, or on a side of an ink-well rather than in the centre. While not being bound by theory, it is believed that the improvement in ink-jet directionality is due to a change in the contact angle of the composition with the inkjet print head.

Additionally, it has been found that the resultant films made from compositions comprising an alcohol ether additive having a boiling point lower that 170° C. are smoother than films made from comparable compositions without such an additive.

Further still, it has been found that the provision of an alcohol ether additive having a boiling point lower than 170° C. results in a composition which is easier to deposit by spin-coating. In fact, the provision of such a additive has made it possible to spin-coat compositions which were previously impossible to spin coat. As such, the present invention has opened up a whole new range of possible compositions for use in organic opto-electrical devices. Some of these compositions have good electrical and optical properties but were previously not usable due to the fact that they were not easily deposited by solution processing techniques.

It is an important characteristic of the present invention that the alcohol ether additives have a boiling point lower than 170° C. The reason for this is that while alcohol ethers have been found to improve the solution processing properties of compositions comprising conductive or semi-conductive organic material, if the alcohol ether remains in the resultant film then the optical and electrical properties of the film can be altered. This can be detrimental to the functional properties and lifetime of the resultant opto-electrical device in which the film is disposed. It has been found that by providing an alcohol ether additive with a boiling point lower than 170° C., the additive improves the solution processability when depositing a film of the composition but then evaporates out of the film such that little or no alcohol ether remains in the finally formed film. As such, the optical and electrical properties such as conductivity of the final film are not significantly affected by the provision of a volatile alcohol ether in the initial composition. In fact, it has been found that opto-electrical devices manufactured using compositions according to the present invention have improved functional properties and lifetime compared with prior art devices due to the positive effect of smoother film formation while avoiding negative impact on the optical and electrical properties of the films disposed therein by avoiding detrimental changes in the chemical composition of the films.

Preferably, the alcohol ether additive has a boiling point lower than 160° C., more preferably less than 150° C. The lower the boiling point of the alcohol ether, the more readily it evaporates from the resultant film. However, if the boiling point of the solvent becomes too low then it may too readily evaporate from the composition prior to deposition unless the composition is kept at low temperatures. Accordingly, it is advantageous for the boiling point of the alcohol ether additive to be higher than 100° C. Preferred alcohol ether additives include 1-methoxy-2-propanol (bp 119° C.), 2-methoxyethanol (bp 124° C.), 2-ethoxyethanol (bp 135° C.), and 2-butoxypropanol (bp 144° C.).

Because little or none of the alcohol ether additive remains in the resultant film formed by compositions of the present invention, the additive can be provided in the composition in relatively large amounts rather than as a minor additive component in the composition. Therefore, the additive may be provided in an amount up to 40% by volume, preferably 5-40%, more preferably 10-20% v/v in the composition. However, the present inventors have found that the alcohol ether additive can improve wetting and jettability of a composition even at low volume concentrations, in particular less than 10% by volume, preferably less than 5% and most preferably in the range 0.1-2% by volume.

The solubility, processability and functional properties of the organic material may be very sensitive to changes in solvent. Accordingly, it is advantageous to retain a portion of solvent in which the organic material is stable. As such, the solvent will typically be the usual solvent used for the organic material for achieving good solubility, processability and conductance characteristics. Suitable solvents for non-polar organic materials include mono- or poly-alkylated benzenes, for example xylene. Water may be a suitable solvent for some organic materials, particularly conductive organic materials such a doped PEDOT.

Compositions according to the invention may comprise further additives in addition to an alcohol ether additive. In one preferred embodiment, the composition further comprises a second additive which is a high boiling point solvent having a boiling point higher than water. The provision of a high boiling point solvent increases the drying time of the composition. Thus, during ink jet printing, the amount of evaporation occurring in the time between deposition of adjacent swathes is reduced leading to a greater uniformity of drying and a more symmetric film formation around a swathe join. In another preferred embodiment, a second, basic additive is used in the case where the conductive or semi-conductive organic material is acidic (for example PEDOT/PSS). In this case, the basic additive can serve to make the composition less corrosive and/or increase the resistivity of the composition. Preferably, a basic additive when used increases the pH of the composition to at least 8. Preferred basic additives are organic bases, more preferably optionally substituted organic amines such as mono-, di- or tri-alkyl amines. Preferred substituents, where present, include hydroxy, thio and amino groups, preferably hydroxy groups.

Typically, there will only be a few seconds until the next swathe is printed when ink jet printing. However, due to the high surface to volume ratio of an ink, drying times are in the order of seconds. As a result significant drying can occur prior to deposition of an adjacent swathe. By using high boiling point solvents, the amount of evaporation occurring in this time can be reduced. Once adjacent swathes have been deposited the drying environment becomes symmetrical resulting in symmetric layer profiles around the swathe join.

The amount and type of high boiling point solvent to be added to a composition will be dependent on how much of a reduction in drying time is desired. This will be dependent on the time taken to print adjacent swathes. Thus, for slower printing times, a slower drying composition is desirable and a larger volume and/or higher boiling point solvent will be required. However, adding too much high boiling point solvent or the wrong type of solvent may have several problematic affects as discussed below.

The amount and/or type of solvent to be used will depend on the speed of ink jet printing (how much time it takes to print successive swathes). The amount and/or type of solvent will also depend on the surface to volume ratio of the ink droplet. For larger ink droplets, evaporation will be slower and for a given print speed, a lower boiling point solvent will be required when compared to an arrangement utilizing smaller droplets. One key feature of embodiments of the present invention is that the print speed, the droplet size/well size, and the boiling point of the solvent are selected such that when a first swathe and a second swathe are successively printed adjacent to each other, the print rate is such that the first swathe does not significantly dry prior to completing printing of the second swathe.

Preferably, the high boiling solvent is present in the composition in a proportion between 10% and 50%, 20% and 40% or approximately 30% by volume. Preferably, the boiling point of the solvent is between 110 and 400 degrees centigrade, 150 and 250 degrees centigrade, or 170 and 230 degrees centigrade.

It has been found that compositions comprising a high boiling point solvent can be difficult to ink jet print and spin-coat. The addition of a volatile alcohol ether additive has been found to be particularly useful in compositions comprising a high boiling point solvent.

For small pixels a higher solid content is generally used. For larger pixels a lower solid content is used. For larger pixels, the concentration of the composition is reduced to get good film forming properties.

If the solvent is very viscous then it can become difficult to ink jet print the composition. If the viscosity of the composition becomes too high then it will not be suitable for ink jet printing without heating the print head. Embodiments of the present invention are preferably of a viscosity such that heating of the print head is not required in order to ink jet print the compositions.

Furthermore, if the contact angle between the solvent and the material of the banks is too large, then the banks may not be sufficiently wetted. Conversely, if the contact angle between the solvent and the banks is too small, then the banks may not contain the composition leading to flooding of the wells.

Thus, selecting an arbitrary high boiling point solvent can alter the wetting characteristics of the composition. For example, if the contact angle between the composition and the bank is too large then on drying the film has thin edges resulting in non-uniform emission. Alternatively, if the contact angle between the composition and the bank is too small then the well will flood. With such an arrangement, on drying, conductive/semi-conductive organic material will be deposited over the bank structure leading to problems of shorting.

Preferably, the composition should have a contact angle with the bank such that it wets the bank but does not flood out of the well. With this arrangement, on drying a coffee ring effect occurs resulting in a thickening of the edges. A more uniform film morphology results producing a more uniform emission in the finished device.

If the contact angle between the electroluminescent material and the conductive material is too high then the conductive material will not be sufficiently wetted by the electroluminescent material.

One solution to the problem of flooding is to select a high boiling point solvent which has a sufficient contact angle such that it is adequately contained in the wells. Conversely, one solution to the problem of insufficient wetting of the banks is to select a high boiling point solvent which does not have a high contact angle with the material of the base of the well and does not have a contact angle with the banks which is too high.

The problem of insufficient wetting or flooding can be controlled by the addition of a suitable additive to modify the contact angle such that the well is sufficiently wetted without flooding. The provision of such a additive can also produce flatter film morphologies. The alcohol ether additives of the present invention can provide this functionality. As the alcohol ether additives of the present invention have a relatively low boiling point they evaporate out of the film and do not affect the functional properties of the film. As such, varying amounts of the alcohol ether additive can be added in order to tune the contact angle of the composition without adversely affecting the functional properties of the resultant film.

In light of the above, preferably the material of the bank structure and the composition used to deposit the conductive polymer layer are selected wherein a static contact angle between said composition and the bank is in the range 30 to 110 degrees, 65 to 80 degrees, preferably approximately 70 degrees.

Preferably, the material of the first electrode and the composition used to deposit the conductive polymer layer are selected wherein a static contact angle between said composition and the first electrode is below 13.5 degrees, more preferably below 10 degrees.

The viscosity will also be dependent on the solid content (the viscosity increases with solid content). The viscosity should be such that the composition is jettable. The solid content of the composition may be between 0.5% and 6%, 1% and 4%, 1% and 2%, and in some cases is preferably 1.5%. The solid content also affects the form of the film after drying. If the solid content is too high then the film forms a dome shape whereas if the solid content is too low then an excessive coffee ring effect occurs.

A further problem in using high boiling point solvents is that the conductivity of the composition may be modified by the high boiling point solvent. One solution to this problem is to select a solvent which does not significantly modify the composition's conductivity. Alternatively, or additionally, a conductivity modifier may be included in the composition to compensate for any change in conductivity caused by the high boiling point solvent. For example, the inclusion of a high boiling point solvent can result in an increase in the conductivity of the composition resulting in problems due to shorting between electrodes. Accordingly, in one arrangement, a conductivity modifier is included in the composition in order to reduce the conductivity of the composition. One example of a conductivity modifier is excess PSS. However, other materials which alter the conductivity of a film formed from the composition may be utilised.

Following on from the above, a particular problem in organic opto-electrical devices is that the conductive organic hole injecting layer may extend beyond the overlying organic semi-conductive layer providing a shorting path between the cathode deposited thereover and the underlying anode. This problem is exacerbated if the contact angle of the conductive organic composition with the bank material is too low. This problem is further exacerbated if the conductivity of the organic hole injecting layer is high. This problem is further exacerbated if the contact angle of the electroluminescent composition with the conductive layer is too large.

One solution to this problem is to modify the bank structure, by, for example, providing a stepped bank structure which increases the length of the shorting path, thus increasing the resistance of the path resulting in less shorting. However, providing a more complex bank structure is expensive and increases the complexity of the manufacturing method for the device.

Accordingly, it would be advantageous to solve this problem without requiring a complex bank structure by tailoring the compositions deposited in the wells such that underlying layers do not extend beyond the layers deposited thereover and provide a shorting path between the electrodes. This may be done, for example, by tailoring the conductive organic composition such that the contact angle between the conductive polymer composition and the bank material is not too low, and/or tailoring the conductive organic composition so that its conductivity is not too high, and/or tailoring the electroluminescent composition and/or the conductive composition such that the contact angle therebetween is not too high.

Asymmetric drying at the swathe join can also lead to shorting paths being created at the swathe join. Accordingly, the use of a high boiling point solvent which alleviates asymmetric drying will also reduce the shorting problem caused by poor film morphologies. The present applicant has found that in some cases quite the opposite effect occurs, i.e. the addition of a high boiling point solvent increases shorting at the swathe joins. This has been found to be due to an increase in the conductivity of the conductive polymer film. Thus, in such cases, a conductivity modifier can be used to reduce the conductivity.

The high boiling point solvent may comprise one or more of ethylene glycol, glycerol, diethylene glycol, propylene glycol, butane 1,4 diol, propane 1,3 diol, dimethyl-2-imidazolidinone, N-methyl-2-pyrrolidone and dimethylsulfoxide, either alone or in a blend.

The high boiling point solvent is preferably a polyol (e.g. ethylene glycol, diethylene glycol, glycerol). It has been found that these solvent improve film uniformity within the pixels and across swathe joins. Furthermore, they do not compromise other aspect of the ink's performance.

It has been found that the composition has a greater wetting capacity on the banks when the solvent used is more "organic" (less polar) i.e. it has less hydroxyl groups. Thus, diols will have a higher wetting capacity than triols.

A light-emitting layer may be deposited as a composition comprising a semi-conductive organic material in a composition according to the present invention. Preferably, the organic material comprises a polymer and most preferably the polymer is either fully or partially conjugated.

A charge injecting layer may be deposited as a composition comprising a conductive organic material in a composition according to the present invention. Preferably, the organic material comprises a polymer and most preferably the organic material comprises PEDOT with a suitable polyanion, for example PSS.

Embodiments of the present invention relate to new PEDOT ink formulations for improved film uniformity within pixels and across swathe joins. Slower drying inks have been formulated which do not compromise other aspects of the ink's performance. This provides an alternative to interlacing which is very slow.

The present applicant has found that the problem of film non-uniformity in PEDOT is very important to device performance. The device performance may not be directly affected significantly by the thickness of the PEDOT film. However, the uniformity of the PEDOT film affects the uniformity of the overlying electroluminescent layer. The EL layer is very sensitive to changes in thickness. Accordingly, the present applicant has found that it is paramount that uniform films of PEDOT profiles are achieved in order to achieve uniform EL profiles.

The quantity of counterion present in a PEDOT:counterion composition is at least sufficient to balance the charge on PEDOT, and the PEDOT:counterion ratio may be in the range 1:10 to 1:30, more preferably in the range 1:15 to 1:20. Preferably, the counterion is a polymeric acid such as a polysulfonic acid (for example PSS or Nafion) or poly acrylic acid. Most preferably, the counterion is PSS.

The compositions of the present invention may be deposited by any solution processing method, for example ink-jet printing, spin-coating, dip-coating, roll-printing or screen printing. The viscosity of the composition for inkjet printing is preferably in the range 2 to 30 mPa, 2 to 20 mPa, 4 to 12 mPa, more preferably 6 to 8 mPa, and most preferably approximately 8 mPa, at 20 degrees centigrade. Higher viscosities may be suitable for other solution processing methods.

In the case where the composition of the invention is inkjet printed, it preferably has a surface tension of at least 35 mN m to avoid leakage of the composition from the inkjet print head.

The compositions of the present invention may comprise more than one alcohol ether additive in order to optimise the properties of the composition. Furthermore, the alcohol ether additive of the present invention may be used in combination with other, non-alcohol ether additives in order to tune the properties of the composition. Examples of other additives include polyacids, for example a polysulfonic acid such as PSS or Nafion®, or poly acrylic acid; and alcohols, in particular polyols such as ethylene glycol.

In the case of PEDOT, it has been found that the swathe join effect is sensitive to the ratio of PEDOT:counterion. Higher counterion compositions result in a decrease in the problem. Preferably, the ratio of PEDOT:counterion is in the range 1:20 and 1:75, 1:20 and 1:50, 1:25 and 1:45, or 1:30 and 1:40.

For example, in one embodiment, a PEDOT:PSS composition of 1:20 gives a poor swathe join, a composition of 1:30 gives a good swathe join, and a composition of 1:40 completely eliminates the swathe join effect. An increase in PSS decreases the conductivity of the composition. Accordingly, the excess PSS (above 1:20) is acting as an insulating material/conductivity modifier. PSS also increases surface energy thus aiding wetting.

According to another aspect of the present invention there is provided a method of manufacturing an opto-electrical device by inkjet printing a composition according to any preceding claim. For example, a method of forming a device by inkjet printing of a formulation comprising PEDOT (or possibly other hole injection materials) and a high-boiling point solvent (higher than water).

According to another aspect of the present invention there is provided a method of manufacturing an opto-electrical device by spin-coating a composition according to the present invention.

According to another aspect of the present invention there is provided an opto-electrical device formed using the compositions described herein.

According to yet another aspect of the present invention there is provided a method of manufacturing an organic light-emissive display comprising: providing a substrate comprising a first electrode layer and a bank structure defining a plurality of wells; depositing a conductive polymer layer over the first electrode; deposition an organic light-emissive layer over the conductive polymer layer; and depositing a second electrode over the organic light-emissive layer, wherein at least one of the conductive polymer layer and the organic light-emissive layer is deposited by ink jet printing a composition as described herein into the plurality of wells.

BRIEF SUMMARY OF THE DRAWINGS

Embodiments of the present invention will now be described, by way of example only, with reference to the accompanying drawings in which.

DETAILED DESCRIPTION OF PREFERRED EMBODIMENTS

Figure 1:
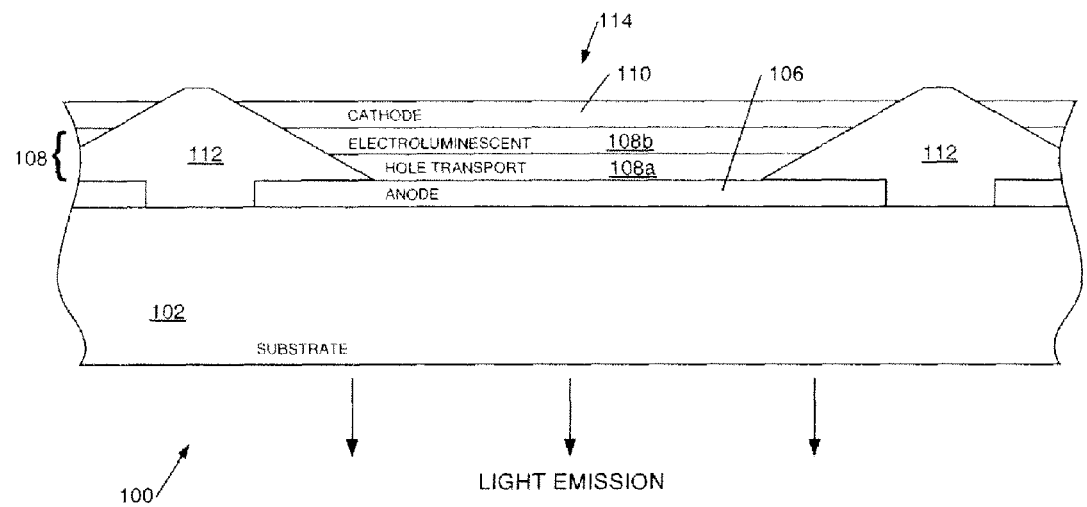
FIG. 1 shows a vertical cross section through an example of an OLED device.
Figure 2:
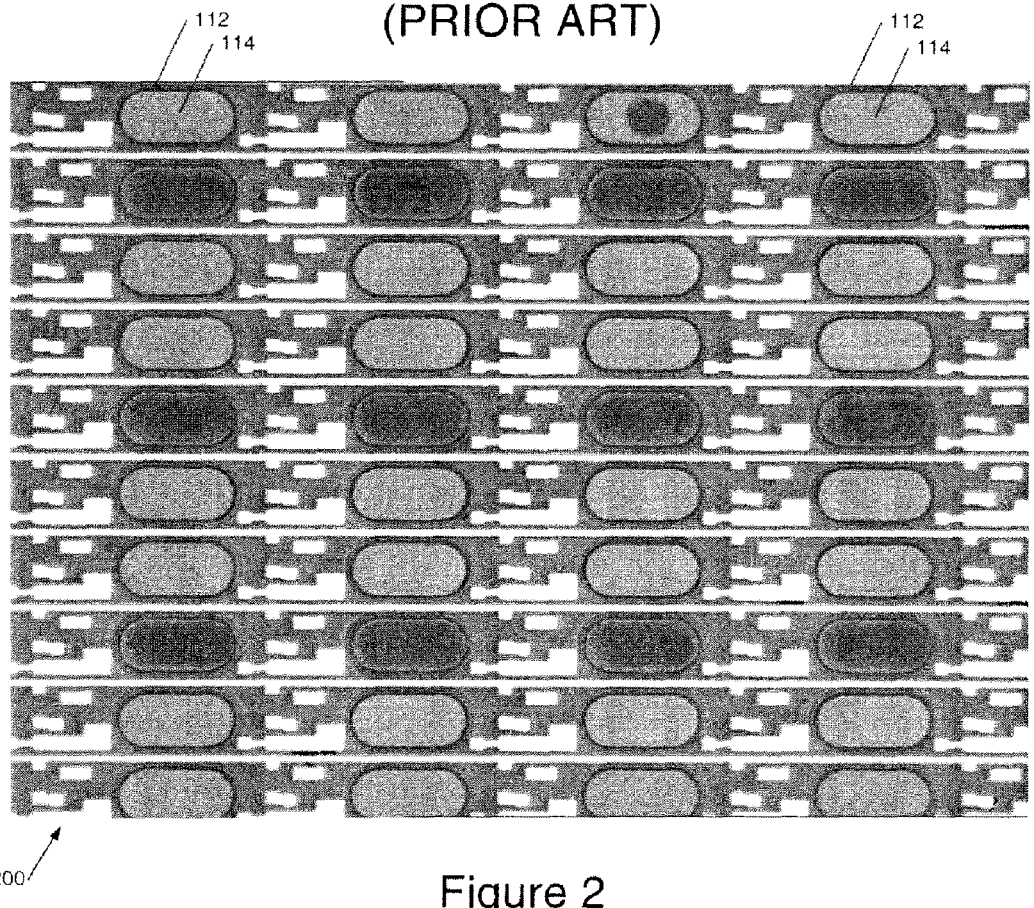
FIG. 2 shows a view from above of a portion of a three colour pixelated OLED display.
Figure 3A:
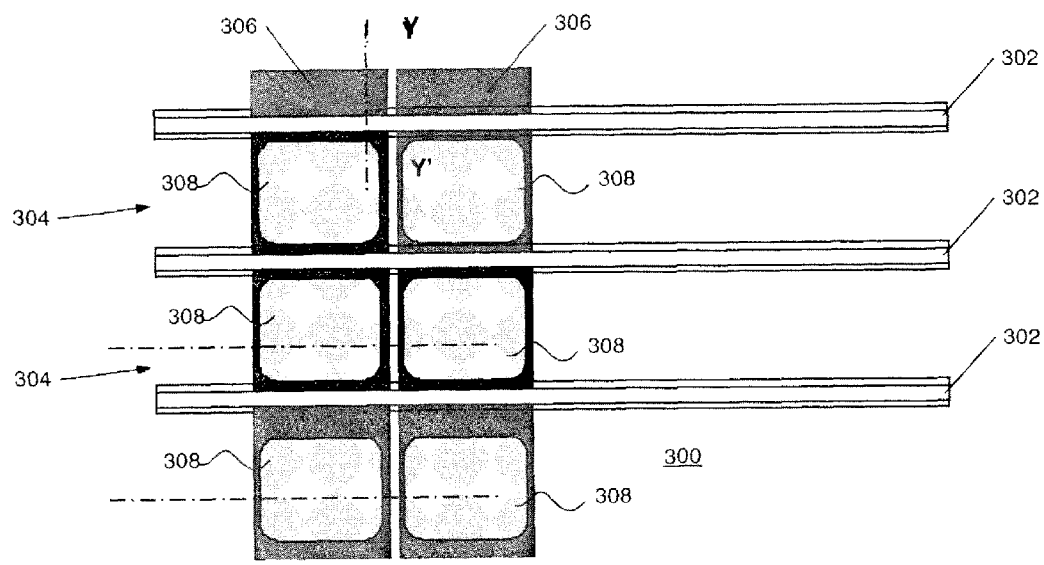
FIGS. 3a and 3b show a view from above and a cross-sectional view respectively of a passive matrix OLED display.
Figure 3B:
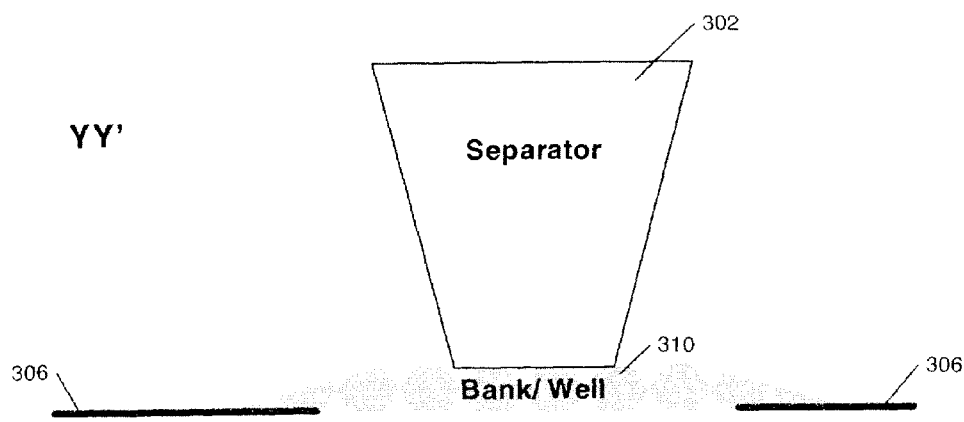

The general device architecture is illustrated in FIG. 1 and has been described above.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Suitable polymers for charge transport and emission may comprise a first repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably first repeat units of formula:

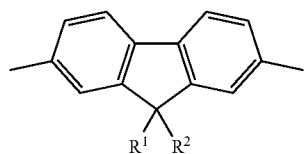

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

A polymer comprising the first repeat unit may provide one or more of the functions of hole transport, electron transport and emission depending on which layer of the device it is used in and the nature of co-repeat units.

In particular:

a homopolymer of the first repeat unit, such as a homopolymer of 9,9-dialkylfluoren-2,7-diyl, may be utilised to provide electron transport;

a copolymer comprising a first repeat unit and a triarylamine repeat unit utilised to provide hole transport and/or emission; or a copolymer comprising a first repeat unit and heteroarylene repeat unit may be utilised for charge transport or emission.

Particularly preferred triarylamine repeat units are selected from optionally substituted repeat units of formulae 1-6:

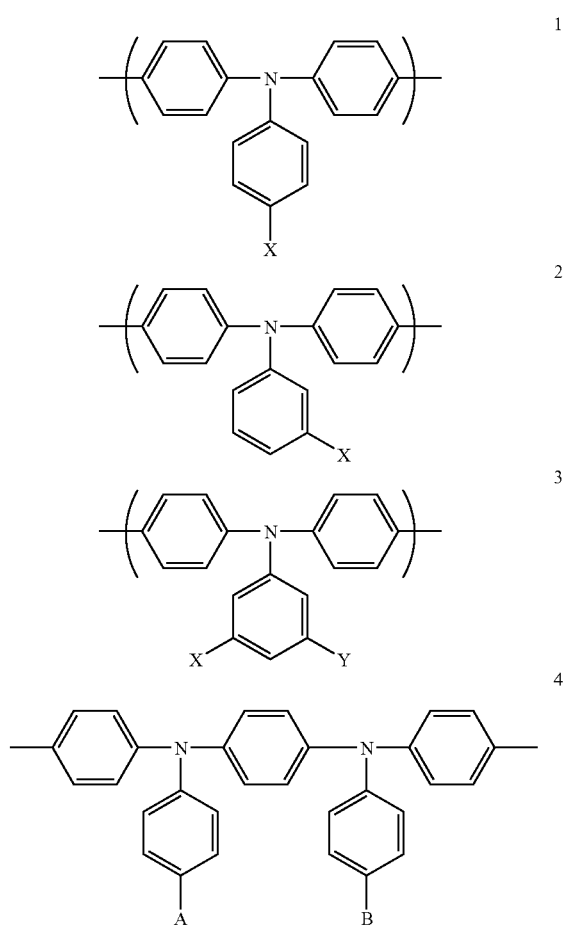

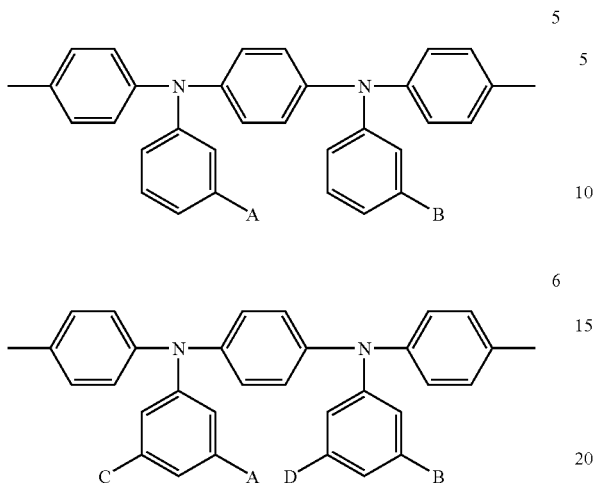

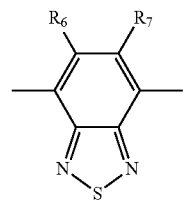

wherein R₆ and R₇ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The aromatic rings in the backbone of the polymer may be linked by a direct bond or a bridging group or bridging atom, in particular a bridging heteroatom such as oxygen.

Also particularly preferred as the triarylamine repeat unit is an optionally substituted repeat unit of formula 6a:

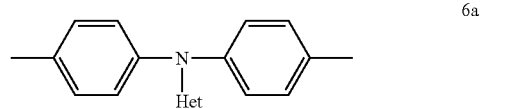

wherein Het represents a heteroaryl group.

Another preferred hole transporting material comprises the repeat unit of general formula (6aa):

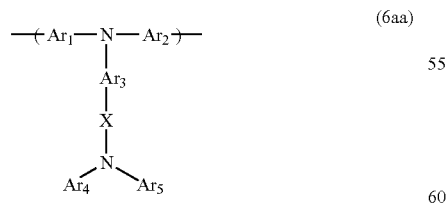

where $Ar_1$, $Ar_2$, $Ar_3$, $Ar_4$ and $Ar_5$ each independently represent an aryl or heteroaryl ring or a fused derivative thereof; and X represents an optional spacer group.

Preferred heteroarylene repeat units are selected from formulae 7-21:

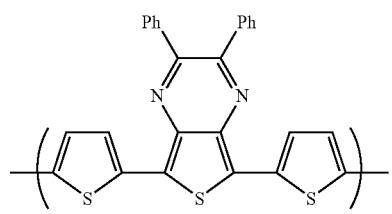

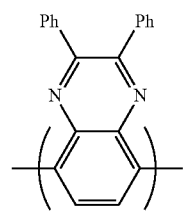

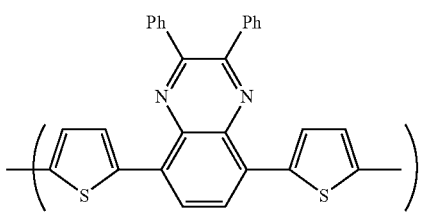

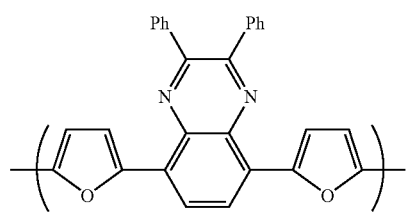

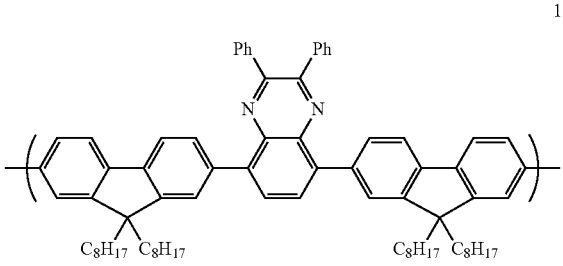

13

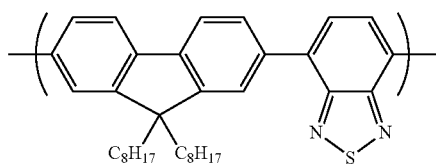

14

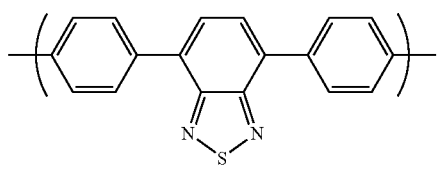

15

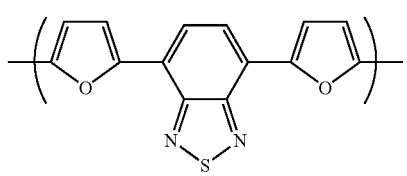

16

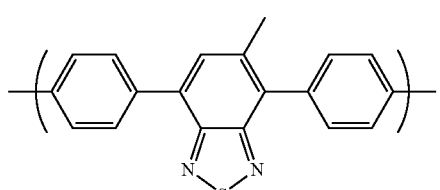

17

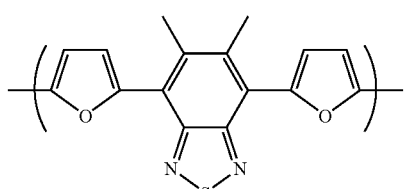

18

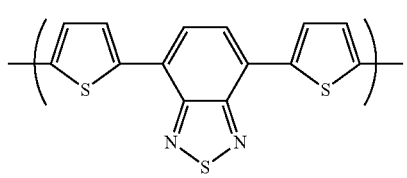

19

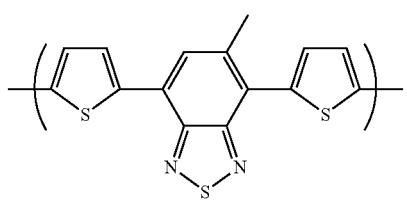

20

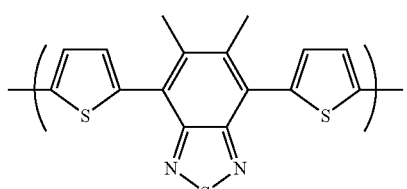

21

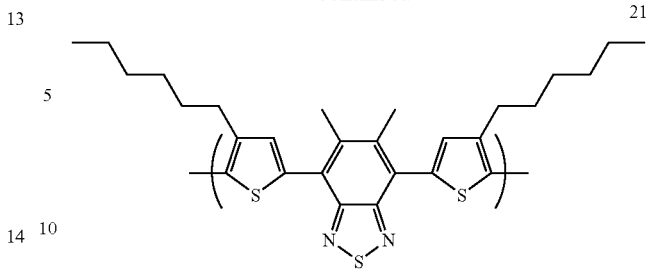

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of these polymers are Suzuki polymerisation as described in, for example, WO 00/53656 and Yamamoto polymerisation as described in, for example, T. Yamamoto, "Electrically Conducting And Thermally Stable □-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

A single polymer or a plurality of polymers may be deposited from solution to form layer 5. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

In some cases, distinct layers of the device may be formed by different methods, for example a hole injection and/or transport layer may be formed by spin-coating and an emissive layer may be deposited by inkjet printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7),1006; poly[4-(N-4-vinylbenzyloxyethyl, N-methylamino)-N-(2,5-di-tert-butylphenylnapthalimide] in Adv. Mater. 1999, 11(4), 285; and poly (para-phenylenes) in J. Mater. Chem. 2003, 13, 50-55. Copolymers are also known as hosts.

The emissive species may be metal complexes. The metal complexes may comprise optionally substituted complexes of formula (22):

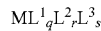
(22)

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:
lanthanide metals such as cerium, samarium, europium, terbium, dysprosium, thulium, erbium and neodymium; and
d-block metals, in particular those in rows 2 and 3 i.e. elements 39 to 48 and 72 to 80, in particular ruthenium, rhodium, pallaidum, rhenium, osmium, iridium, platinum and gold.

Suitable coordinating groups for the f-block metals include oxygen or nitrogen donor systems such as carboxylic acids, 1,3-diketonates, hydroxy carboxylic acids,
Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (VI):

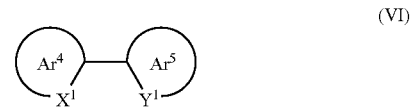
(VI)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.
Examples of bidentate ligands are illustrated below:

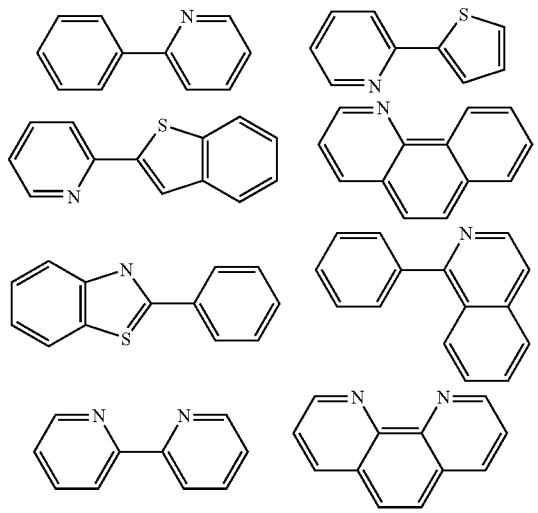

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e. g., Macromol. Sym. 125 (1997) 1-48, U.S. Pat. Nos. 5,150,006, 6,083,634 and U.S. Pat. No. 5,432,014]. Suitable ligands for di or trivalent metals include: oxinoids, e. g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

Composition Formation Procedure

The composition according to the invention may be prepared by simply blending the alcohol ether additive with the conductive or semi-conductive organic material.

In the case of doped PEDOT, the alcohol ether additive may be blended with a commercially available aqueous dispersion of doped PEDOT, for example PEDOT:PSS sold under the name Baytron P® by H C Starck of Leverkusen, Germany. Further solvents and/or additives may also be added in order to optimise the properties of the dispersion such as its jettability, drying characteristics and resistivity, and/or in order to improve the performance of the end device. Exemplary further additives include polymeric acids, for example excess PSS, and exemplary further solvents include alcohols, in particular polyols such as ethylene glycol.

An exemplary composition according to the present invention comprises commercially available Baytron P VP AI4083 to which is added extra PSS, ethylene glycol and an alcohol ether additive.

Device Manufacturing Procedure

The procedure follows the steps outlined below:
1) Depositing a PEDT/PSS composition according to the present invention onto indium tin oxide supported on a glass substrate (available from Applied Films, Colorado, USA) by spin coating.
2) Depositing a layer of hole transporting polymer by spin coating from xylene solution having a concentration of 2% w/v.
3) Heating the layer of hole transport material in an inert (nitrogen) environment.
4) Optionally spin-rinsing the substrate in xylene to remove any remaining soluble hole transport material.
5) Depositing an organic light-emissive material comprising a host material and an organic phosphorescent material by spin-coating from xylene solution.
6) Depositing a metal compound/conductive material bi-layer cathode over the organic light-emissive material and encapsulating the device using an airtight metal enclosure available from Saes Getters SpA.

Full Colour Display Manufacturing Procedure

A full colour display can be formed according to the process described in EP 0880303 by forming wells for red, green and blue subpixels using standard lithographical techniques; inkjet printing PEDT/PSS into each subpixel well; inkjet printing hole transport material; and inkjet printing red, green and blue electroluminescent materials into wells for red, green and blue subpixels respectively.

Sample Experimental Results

1. Conductivity

Baytron P CH8000 is a PEDOT:PSS composition which is commercially available form HC Stark. It has a PEDOT:PSS ratio of 1:20 and particle size of 20-30 nm. Compositions comprising Baytron P CH8000 were made up containing varying amounts of alcohol ether additive and deposited to form films.

The conductivity measurements were taken by spinning a film of PEDOT-PSS onto an inter-digitated test structure to a thickness of 10 microns (as measured using DekTak apparatus).and using a modified four-point probe in order to record the lateral resistivity across the bottom of the PEDOT film. The resistivity of the bulk PEDOT film is assumed to be the same.

Results are shown in Table 1. It can be seen that addition of varying amounts of 1-methoxy-2-propanol does not significantly change the resistivity of the resultant film even when another additive such as a high boiling point diethyleneglycol is included in the composition.

2. Device Lifetime

Organic electroluminencent devices were manufactured according to the previously described process. Devices were manufactured with and without an alcohol ether additive in the PEDOT:PSS composition.

Table 2 indicates the results of lifetime measurements for a device manufactured using a PEDOT:PSS composition comprising 20% butoxypropanol in comparison with an analogous device in which no alcohol ether additive was utilized in the PEDOT:PSS composition.

Table 3 indicates the results of lifetime measurements for a device manufactured using a PEDOT:PSS composition comprising 20% methoxypropanol in comparison with an analogous device in which no alcohol ether additive was utilized in the PEDOT:PSS composition.

In Tables 2 and 3, temperatures are given in degrees centigrade, initial luminance is given in $cd/m^2$, and lifetimes are given in hours.

It can be seen that in the lifetime of the device is increased, or at least not decreased, by depositing the PEDOT:PSS in a composition comprising a volatile alcohol ether additive.

3. Processability

Formulations according to the present invention provide improved inkjet and surface wetting characteristics, even at low concentration (0.1 to 2 vol. %).

TABLE 1

| PEDT/PSS | 1-Methoxy-2-propanol, vol % | Other Additives | Resistivity, of ohm-cm | |
|---|---|---|---|---|
| BaytronP CH8000 | 0 | 0 | 100000 | |
| BaytronP CH8000 | 10 | 0 | 103000 | Addition of methoxypropanol did not change film resistivity of CH8000 |

TABLE 1-continued

| PEDT/PSS | 1-Methoxy-2-propanol, vol % | Other Additives | Resistivity, of ohm-cm | |
|---|---|---|---|---|
| BaytronP CH8000 | 0 | Diethyleneglycol PSS | 60 | |
| BaytronP CH8000 | 5 | Diethyleneglycol PSS | 80 | |
| BaytronP CH8000 | 10 | Diethyleneglycol PSS | 46 | Addition of methoxypropanol did not change film resistivity in presence of other additives |

TABLE 2

| | Temperature | Initial Lum | Max Lifetime | Average Lifetime | Hours Tested |
|---|---|---|---|---|---|
| PEDOT:PSS | 23.000 | 3996.500 | 117.790 | 102.726 | 167.823 |
| PEDOT:PSS + 20% butoxypropanol | 23.000 | 4003.067 | 157.862 | 147.775 | 217.020 |

TABLE 3

| | Temperature | Initial Lum | Max Lifetime | Average Lifetime | Hours Tested |
|---|---|---|---|---|---|
| PEDOT:PSS | 23.000 | 801.150 | 51.561 | 28.358 | 64.548 |
| PEDOT:PSS + 20% methoxypropanol | 23.000 | 804.723 | 51.575 | 30.611 | 55.442 |

The invention claimed is:

1. A composition for use in the manufacture of an opto-electrical device, the composition comprising: a conductive or semi-conductive organic material; a solvent; a first additive; and a second additive, wherein the first additive is an alcohol ether having a boiling point lower than 170° C., and the second additive is a high boiling point solvent having a boiling point higher than water.

2. The composition according to claim 1, wherein the composition is at least one of a dispersion, a solution, and an aqueous composition.

3. The composition according to claim 1, wherein the alcohol ether additive has a boiling point lower than 160° C.

4. The composition according to claim 1, wherein the alcohol ether additive is selected from the group consisting of 1-methoxy-2-propanol, 2-methoxyethanol, 2-ethoxyethanol, and 2-butoxypropanol.

5. The composition according to claim 1, wherein the alcohol ether additive is provided in an amount less than 10% by volume in the composition.

6. The composition according to claim 1, wherein the second additive is present in the composition in a proportion between 10% and 50% by volume.

7. The composition according to claim 1, wherein the boiling point of the second additive is between 110° C. and 400° C.

8. The composition according to claim 1, wherein the second additive comprises a polyol.

9. The composition according to claim 1, wherein second additive comprises one or more of ethylene glycol, glycerol, diethylene glycol, propylene glycol, butane 1,4 diol, propane 1,3 diol, dimethyl-2-imidazolidinone, N-methyl-2-pyrrolidone, and dimethylsulfoxide.

10. The composition according to claim 1, wherein the composition further comprises a conductivity modifier.

11. The composition according to claim 1, wherein the organic material is polymeric.

12. The composition according to claim 1, wherein the organic material comprises a hole injecting material.

13. The composition according to claim 12, wherein the hole injecting material comprises polyethylene-dioxythiophene ("PEDOT") with a charge-balancing counterion.

14. The composition according to claim 13, wherein the ratio of PEDOT:counterion is between 1:10 and 1:75.

15. The composition according to claim 13, wherein the counterion is polystyrene-sulfonate ("PSS").

16. A method of manufacturing an opto-electrical device comprising ink jet printing a composition according to claim 1.

17. An opto-electrical device formed using the composition of claim 1.

18. A method of manufacturing an organic light-emissive display comprising: providing a substrate comprising a first electrode layer and a bank structure defining a plurality of wells; depositing a conductive organic layer over the first electrode; deposition an organic light-emissive layer over the conductive organic layer; and depositing a second electrode over the organic light-emissive layer, wherein at least one of the conductive organic layer and the organic light-emissive layer is deposited by ink jet printing a composition according to claim 1 into the plurality of wells.

19. The method according to claim 18, wherein the material of the bank structure and the composition used to deposit the conductive polymer layer are selected wherein a static contact angle between said composition and the bank is in the range 30 to 110 degrees.

20. The composition according to claim 1, wherein the alcohol ether additive has a boiling point higher than 100° C.

* * * * *